United States Patent
Ward et al.

(10) Patent No.: US 8,006,152 B2
(45) Date of Patent: Aug. 23, 2011

(54) SCAN CHAIN FAIL DIAGNOSTICS

(75) Inventors: Samuel I. Ward, Round Rock, TX (US); Patrick R. Crosby, Austin, TX (US); William D. Ramsour, Pflugerville, TX (US); Bao G. Truong, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 12/351,950

(22) Filed: Jan. 12, 2009

(65) Prior Publication Data

US 2010/0180168 A1 Jul. 15, 2010

(51) Int. Cl.
*G01R 31/28* (2006.01)
(52) U.S. Cl. ........ 714/729; 714/726; 714/732; 714/735; 714/738; 714/742
(58) Field of Classification Search .................. 714/726, 714/729, 732, 735, 738, 739, 742
See application file for complete search history.

(56) References Cited

U.S. PATENT DOCUMENTS

| | | | |
|---|---|---|---|
| 4,503,536 A | 3/1985 | Panzer | |
| 5,727,000 A | 3/1998 | Pizzica | |
| 5,912,901 A | 6/1999 | Adams et al. | |
| 6,327,687 B1 | 12/2001 | Rajski et al. | |
| 6,543,020 B2 | 4/2003 | Rajski et al. | |
| 6,557,129 B1 | 4/2003 | Rajski et al. | |
| 6,678,739 B1 | 1/2004 | Muraoka | |
| 6,751,767 B1 | 6/2004 | Toumiya | |
| 6,950,974 B1 | 9/2005 | Wohl et al. | |
| 7,111,209 B2 | 9/2006 | Rajski et al. | |
| 7,225,376 B2 | 5/2007 | Appinger et al. | |
| 7,284,176 B2 | 10/2007 | Wang et al. | |
| 7,302,624 B2 | 11/2007 | Rajski et al. | |
| 7,302,626 B2 | 11/2007 | Balakrishnan et al. | |
| 7,444,567 B2 * | 10/2008 | Wang et al. | 714/726 |
| 7,487,420 B2 * | 2/2009 | Keller | 714/732 |
| 7,747,920 B2 * | 6/2010 | Wang et al. | 714/731 |
| 2006/0200719 A1 | 9/2006 | Keller | |
| 2007/0050693 A1 * | 3/2007 | Kiryu | 714/733 |
| 2010/0218062 A1 * | 8/2010 | Wang et al. | 714/731 |
| 2010/0287430 A1 * | 11/2010 | Wang et al. | 714/731 |

OTHER PUBLICATIONS

Bayraktaroglu. I., et al., "Concurrent Application of Compaction and Compression for Test Time and Data Volume Reduction in Scan Designs", IEEE 2003, Transactions on Computers, V. 52 #11, Nov. 2003.

* cited by examiner

*Primary Examiner* — John J Tabone, Jr.
(74) *Attorney, Agent, or Firm* — Patrick E. Caldwell, Esq.; The Caldwell Firm, LLC (57) ABSTRACT

A method comprises generating a test pattern for a device under test (DUT), wherein the DUT comprises a plurality of scan chains coupled to a plurality of multiple input shift registers (MISRs). The plurality of faults detected by a first MISR and by a second MISR are identified. In the event the plurality of faults detected by the first MISR does not include any of the plurality of faults detected by the second MISR and the plurality of faults detected by the second MISR does not include any of the plurality of faults detected by the first MISR, the first MISR and the second MISR are coupled as an independent MISR pair. The test pattern is applied to the DUT to generate a scan chain output. The independent MISR pair captures the scan chain output to generate a test signature. The test signature is compared with a known good signature.

20 Claims, 6 Drawing Sheets

SCAN CHAIN FAIL DIAGNOSTICS

CROSS-REFERENCE TO RELATED APPLICATIONS

This application relates to co-pending U.S. patent application Ser. No. 12/354,063 entitled IMPROVED TEST PATTERN COMPRESSION, filed concurrently herewith.

TECHNICAL FIELD

The present invention relates generally to the field of circuit testing and, more particularly, to a system and method for improved scan chain fail diagnostics.

BACKGROUND OF THE INVENTION

Modern circuit design incorporates methods and hardware that enable circuit testing upon completion of production, often referred to as "design for test" or "design for testability" (DFT). One DFT technique utilizes scan chains. In a scan chain system, certain latches, independent of their assigned cone of logic, couple together into a hardware connection known as a "scan chain." The test system inputs a test pattern into the scan chain latches, which the system then uses to test the functionality of the circuit. As such, scan chains allow for increased testability and observability of an integrated circuit design.

Many systems use multiple-input signature registers (MISRs) coupled to the scan chain outputs to generate a unique signature for specific test response sequence. The MISRs generate and store the resulting signature from the test responses. Typical systems compare the resulting signature with signatures of known good, fault-free circuits to determine whether the circuit under test (CUT) (also sometimes referred to as a "device under test" (DUT)) is functioning correctly. Generally, one skilled in the art will understand that the DUT also comprises a variety of circuitry in addition to the scan chains and MISRs.

Common test systems can generate the test sequences in multiple ways, including though automatic test pattern generation (ATPG) for targeted tests or through pseudo random pattern generators (PRPGs), such as linear feedback shift registers (LFSRs), for example. These test sequences can cover over 100,000 or more individual testing events that are compacted into a single signature within a MISR. Though the signature effectively reduces the total output data down to the width of the MISR (usually between 10 and 40 bits from 100,000×50,000), diagnosing fails within the system becomes significantly more difficult and time consuming as compaction increases.

Most current testing methodologies operate in a predictable manner. A PRPG supplies patterns to be pushed into the scan chains. A functional clock cycle activates and pushes these patterns through the CUT's logic. After a set number of functional clock cycles, the process serially feeds the state of every latch into a MISR through the scan chains. After all of the latch states have been scanned into the MISR, the testing process evaluates the resultant signature for correctness. In the event that the resultant signature is correct, the testing process takes no further action, as the CUT is working properly. In the event that the resultant signature is incorrect, common test systems must execute a complicated series of additional tests to identify the failing scan chain, frequently requiring multiple runs of the exact same test pattern.

Therefore, there is a need for a system and/or method for scan chain fail diagnostics that addresses at least some of the problems and disadvantages associated with conventional systems and methods.

BRIEF SUMMARY

The following summary is provided to facilitate an understanding of some of the innovative features unique to the embodiments disclosed and is not intended to be a full description. A full appreciation of the various aspects of the embodiments can be gained by taking into consideration the entire specification, claims, drawings, and abstract as a whole.

A method comprises generating a test pattern for a device under test (DUT), wherein the DUT comprises a plurality of scan chains coupled to a plurality of multiple input shift registers (MISRs). The plurality of faults detected by a first MISR and by a second MISR are identified. In the event the plurality of faults detected by the first MISR does not include any of the plurality of faults detected by the second MISR and the plurality of faults detected by the second MISR does not include any of the plurality of faults detected by the first MISR, the first MISR and the second MISR are coupled as an independent MISR pair. The test pattern is applied to the DUT to generate a scan chain output. The independent MISR pair captures the scan chain output to generate a test signature. The test signature is compared with a known good signature.

A system comprises a testing module configured to generate a test pattern for a device under test (DUT), wherein the DUT comprises a plurality of scan chains coupled to a plurality of multiple input shift registers (MISRs). The testing module also comprises a signature generation module configured to identify the plurality of faults detected by a first MISR and to identify the plurality of faults detected by a second MISR. The testing module further comprises a MISR comparison module configured to, in the event the plurality of faults detected by the first MISR does not include any of the plurality of faults detected by the second MISR and the plurality of faults detected by the second MISR does not include any of the plurality of faults detected by the first MISR, couple the first MISR and the second MISR as an independent MISR pair. The testing module is further configured to apply the test pattern to the DUT to generate a scan chain output. The independent MISR pair is configured to capture the scan chain output to generate a test signature. The testing module compares the test signature with a known good signature.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope of the invention.

In the following discussion, numerous specific details are set forth to provide a thorough understanding of the present invention. Those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

Figure 1:
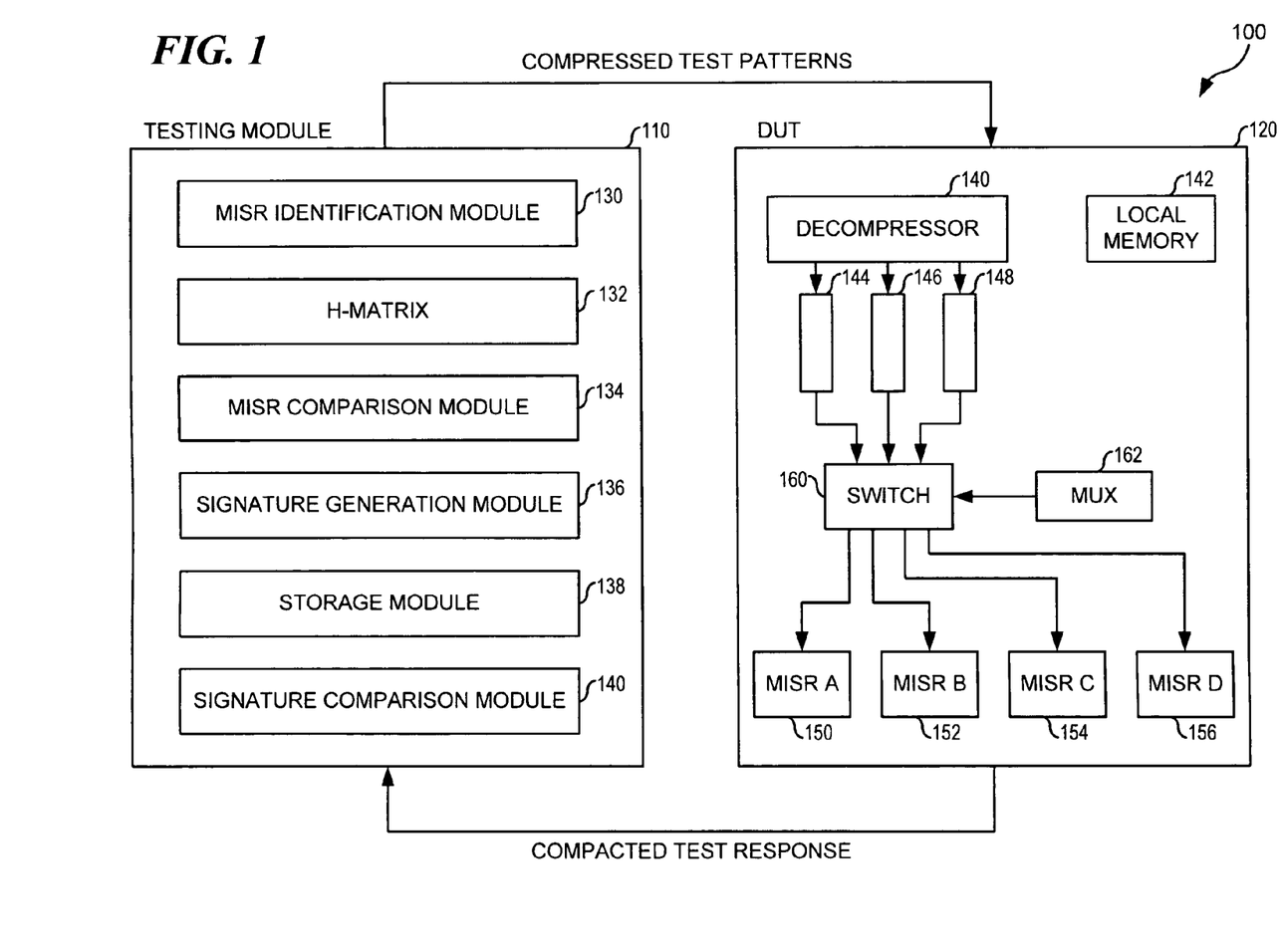
FIG. 1 illustrates a block diagram showing an improved scan chain fail diagnostics system in accordance with a preferred embodiment.

Referring now to the drawings, FIG. 1 is a high-level block diagram illustrating certain components of a system 100 for improved scan chain diagnosis, in accordance with a preferred embodiment of the present invention. System 100 comprises a testing module 110 and a device under test (DUT) 120.

Testing module 110 is an otherwise conventional testing module modified as described below. Generally, testing module 110 generates test patterns and performs operational tests upon DUT 120. Testing module 110 includes MISR identification module 130, H-matrix 132, MISR comparison module 134, signature generation module 136, storage module 138, and signature comparison module 140.

DUT 120 is an otherwise conventional DUT modified as described below. Generally, DUT 120 is a densely packed circuit or other device produced through a DFT process based on the utilization of scan chains. DUT 120 includes decompressor 140, local memory 142, various scan chains 144, 146, and 148, MISR A 150, MISR B 152, MISR C 154, MISR D 156, switch 160, and multiplexor (mux) 162.

In an illustrative operative embodiment, testing module 110 performs conventional testing operations upon DUT 120, modified as described herein. In addition, MISR identification module 130 identifies all MISRs within DUT 120. MISR comparison module 134 identifies independent MISR pairs within DUT 120. Generally, as used herein an "independent MISR pair" is a pair of MISRs for which the faults detected by the scan chains coupled to the MISRs do not overlap. That is, for a first MISR, the faults detected by the first MISR's scan chains are not detected by a second MISR's scan chains, and the faults detected by the second MISR's scan chains are not detected by the first MISR's scan chains.

In one embodiment, MISR comparison module 134 compares each scan chain and MISR of the DUT to identify all possible independent PAIR combinations. In an alternate embodiment, MISR comparison module 134 compares each scan chain and MISR of the DUT to determine whether every MISR can be coupled in an independent MISR pair. In an alternate embodiment, for each MISR, MISR comparison module 134 compares the scan chains for the other MISRs to identify a suitable independent MISR pair partner, if any, and continues until each MISR has been assessed.

In one embodiment, MISR identification module 130 identifies the scan chains feeding into each MISR, and the faults detected by those scan chains. In one embodiment, MISR identification module 130 also pairs independent MISRs identified by MISR comparison module 134. As such, in one embodiment, MISR comparison module 134 presents MISR identification module 130 with all of the independent MISR pairings available on DUT 120 and MISR identification module 130 couples MISRs into independent pairs based on a predetermined algorithm (such as, for example, an algorithm that leaves the fewest MISRs unpaired).

For example, in an exemplary embodiment, MISR identification module 130 determines that scan chain 144 feeds into MISR A 150 and MISR C 154; scan chain 146 feeds into MISR A 150 and MISR D 156; and scan chain 148 feeds into MISR B 152. MISR identification module 130 also determines that none of the faults identified by scan chain 144 are identified by scan chains 146 or 148; none of the faults identified by scan chain 146 are identified by scan chains 144 or 148; and none of the faults identified by scan chain 148 are identified by scan chains 144 or 146.

MISR comparison module 134 determines that MISR A 150 is independent from MISR B 152, but not MISR C 154 or MISR D 156. MISR comparison module 134 determines that MISR C 154 is independent from MISR B 152 and MISR D 156, but not MISR A 150. MISR comparison module 134 determines that MISR D 156 is independent from MISR B 152 and MISR C 154, but not MISR A 150.

Accordingly, MISR identification module couples MISR A 150 and MISR B 152 as an independent pair, and couples MISR C 154 and MISR D 156 as an independent pair. In one embodiment, MISR identification module 130 couples MISRs as an independent pair by setting a bit in a matrix. In an alternate embodiment, MISR identification module 130 couples MISRs as an independent pair by generating an H-matrix for the independent pair. Generally, an H-matrix is a set of words comprising bits that indicate which scan chain to feed into a MISR of a MISR pair, described in more detail below. In the illustrated embodiment, MISR identification module 130 sets H-matrix 132 according to the coupled independent MISR pairs.

Having identified the independent MISR pairs, signature generation module 136 generates or retrieves known good signatures based on the test pattern for the DUT 120. In one embodiment, signature generation module 136 stores known good signatures in a database, such as storage module 138, for example. Generally, a known good standard signature represents fault-free operation of the DUT 120. In an alternate embodiment, signature generation module 136 generates known good signatures by applying a series of test patterns to a known good DUT and capturing the MISR outputs.

In one embodiment, signature generation module 136 generates signals for multiple combinations of scan chains and MISRs. For example, in one embodiment, signature generation module 136 generates known good signatures with the known good DUT configured in its default configuration, with each MISR coupled to its default scan chains, in a "standard signature run". Module 136 also generates known good signatures with the known good DUT configured according to the plurality of configurations identified in an H-matrix, in a "diagnostic signature run." Thus, module 136 generates the expected signatures for a fault-free DUT, for comparison with capture results on unknown DUTs. Testing module 110 stores the collected expected signatures in storage module 138.

For unknown DUTs, testing module generally operates as follows. First, testing module 110 runs the standard testing sequence for all scan chains in DUT 120, with the MISRs coupled in the default arrangement, producing a standard testing sequence signature output. Signature comparison module 140 compares the signature output with the expected output from storage module 138. If the signature output matches the expected output, DUT 120 is operating normally. If the signature output does not match the expected output, one or more scan chains are failing.

In one embodiment, the testing module receives the test output signatures and compares the received test output signatures with the known good signatures from storage module 138. In an alternate embodiment, testing module 110 loads the known good signatures to DUT 120, and DUT 120 compares the known good signatures with the test output signatures, and DUT 120 reports the result to testing module 110. In one embodiment, DUT 120 compares the standard signatures and testing module 110 compares the diagnostic signatures.

If one or more of the scan chains are failing, testing module 110 runs the diagnostic testing sequence indicated in the H-matrix, producing a set of diagnostic signature outputs.

Signature comparison module 140 compares the diagnostic outputs with the expected outputs from storage module 138. As described in more detail below, the results of this comparison can identify which scan chain is failing in fewer steps than conventional methods.

Specifically, in common systems, the test system runs though a number of iterations of test pattern scan-in, functional clock cycles, and scan-out, masking all but one scan chain MISR input. The common testing process masks all other MISR inputs such that only the scan chain under examination in that iteration contributes to the formation of the signature. The resultant MISR signature indicates whether the non-masked scan chain failed to perform as intended. The iterations repeat until the testing process determines which scan chain contains the fault causing the MISR signature to deviate from its expected signature.

As integrated circuits become ever more complex, the scan chains also become more complex and lengthy. And in order for most systems to identify a failing scan chain, the system must test each scan chain serially while masking off all of the other scan chains. This process results in significant test time, and negates much of the advantage gained by utilizing MISRs in the design.

Figure 2A:
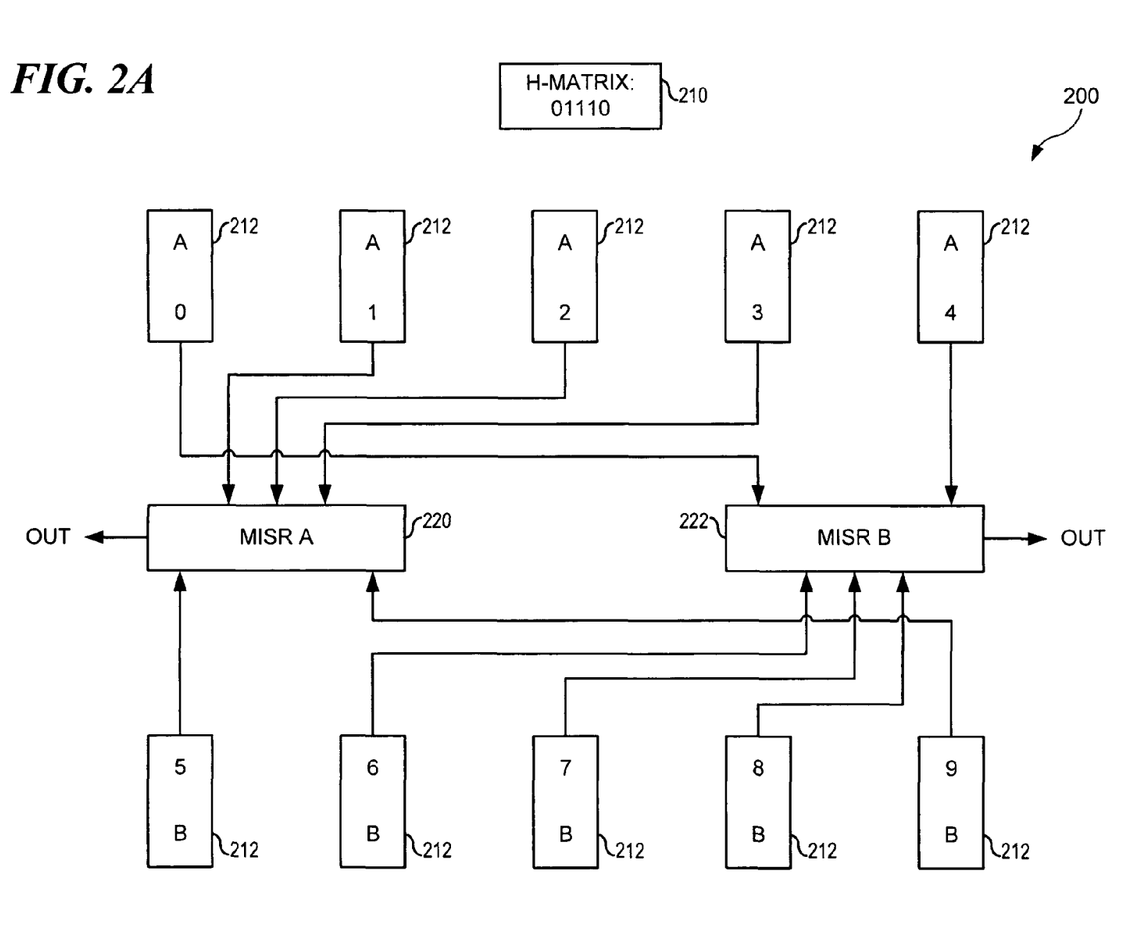
FIGS. 2a and 2b illustrate block diagrams showing an improved scan chain fail diagnostics system in accordance with a preferred embodiment.

But in the novel embodiments described herein, the testing system couples scan chains in independent MISR pairs in a predetermined set of configurations, which reduces the number of steps required to identify a failing scan chain. For example, system 200 of FIG. 2A, illustrates an exemplary connection of paired independent MISRs using an H-matrix.

Generally, H-matrix 210 includes a plurality of entries, with each entry indicating which scan chains couple to which MISR in the pair. In the illustrated embodiment, the depicted H-matrix entry is "01110". In the illustrated embodiment, the entries in H-matrix are consistent with an odd-weight hamming code similar to error correction codes (ECC). In one embodiment, the H-matrix entries conform to a hamming distance of four, which guarantees identification of up to two scan chain fails within the same MISR. Testing processes configured for greater identification of scan chain fails can be configured with higher hamming distances and H-matrices with more numerous entries.

As shown, a plurality of scan chains 212 couple to a MISR A 220 or a MISR B 222. H-matrix 210 determines to which MISR a scan chain couples. For example, for MISR A 220, for each H-matrix position with a 1, the MISR receives its default scan chain, and for each H-matrix position with a 0, the MISR receives the scan chain of the other MISR in the independent pair. As such, MISR A 220 receives scan chain B5 212 in the first position, scan chains A1, A2, and A3 212 in the second through fourth positions, and scan chain B9 212 in the fifth position. For MISR B 222, for each H-matrix position with a 0, the MISR receives its default scan chain, and for each H-matrix position with a 1, the MISR receives the scan chain of the other MISR in the independent pair. As such, MISR B 220 receives scan chain A0 212 in the first position, scan chains B6, B7, and B8 212 in the second through fourth positions, and scan chain A4 212 in the fifth position.

In standard testing mode, the output of MISR A 220 is based on the default "A" scan chains (A0, A1, A2, A3, and A4) and the output of MISR B 222 is based on the default "B" scan chains (B5, B6, B7, B8, and B9). If the standard testing output signatures for MISR A 220 and MISR B 222 match the known good signatures, then the DUT passes the test events captured by those scan chains. If the standard testing output signatures do not match the known good signatures, then one or more scan chain test event has failed.

For example, if the MISR A 220 output signature mismatches the known good signature, the test engineer knows that one of the default "A" scan chains has failed. In prior art systems, the test engineer would have to re-run the test a maximum of 5 more times, masking out all but one of the scan chain inputs to MISR A 220 until the failing scan chain is identified. But in the present embodiment, the test engineer can runs the diagnostic tests fewer than 5 times to identify the failing scan chain.

For example, using the H-matrix entry "01110", the test module runs diagnostic testing comparing the outputs of MISR A 220 and MISR B 222 with the known good signatures. If the MISR A 220 output fails, the test engineer knows that the failing scan chain is one of A1, A2, or A3, since B5 and B9 are known to pass based on the standard testing result. If the MISR B 222 output now fails, the test engineer knows that the failing scan chain is one of A0 or A4, since B6, B7, and B8 are known to pass based on the standard testing result.

As such, in a single test run, the testing module has eliminated at least two scan chains from consideration as the failing scan chain, which is a significant improvement over prior art systems. In the illustrated embodiment, the H-matrix 210 is shown with a single entry, "01110" for illustrative purposes. In a preferred embodiment, H-matrix 210 includes a plurality of entries, configured with a hamming distance appropriate to the desired level of detection in the system. For example, a second entry, "01101" (a hamming distance of 2), can eliminate another scan chain from consideration when considered with the standard test results and the diagnostic results of the entry "01110." Thus, by judicious selection of the H-matrix 210 entries, the failing scan chain can be guaranteed to be found in fewer steps than the prior art method of masking a single entry at a time.

For larger numbers of scan chains, the H-matrix can be configured with more entries, with a larger hamming distance between entries. For example, for a system with eleven scan chains per MISR, the following H-matrix is configured with a hamming distance of 6:

| | |
|---|---|
| 1 | 01110101101 |
| 2 | 00111010111 |
| 3 | 10011101011 |
| 4 | 11001110101 |
| 5 | 11100111010 |

In one embodiment, identifying the scan chain comprises automatically eliminating each scan chain within the diagnostic signature that feeds a good signature, and noting the results in a set of scoreboard registers with each column representing a particular scan chain. Once all good signatures are removed (by placing a zero (0) bit in the positions representing the scan chains contributing to the good signature, the test module ANDs each column together. In the columns with a one (1), that particular scan chain contains an error.

Figure 2B:
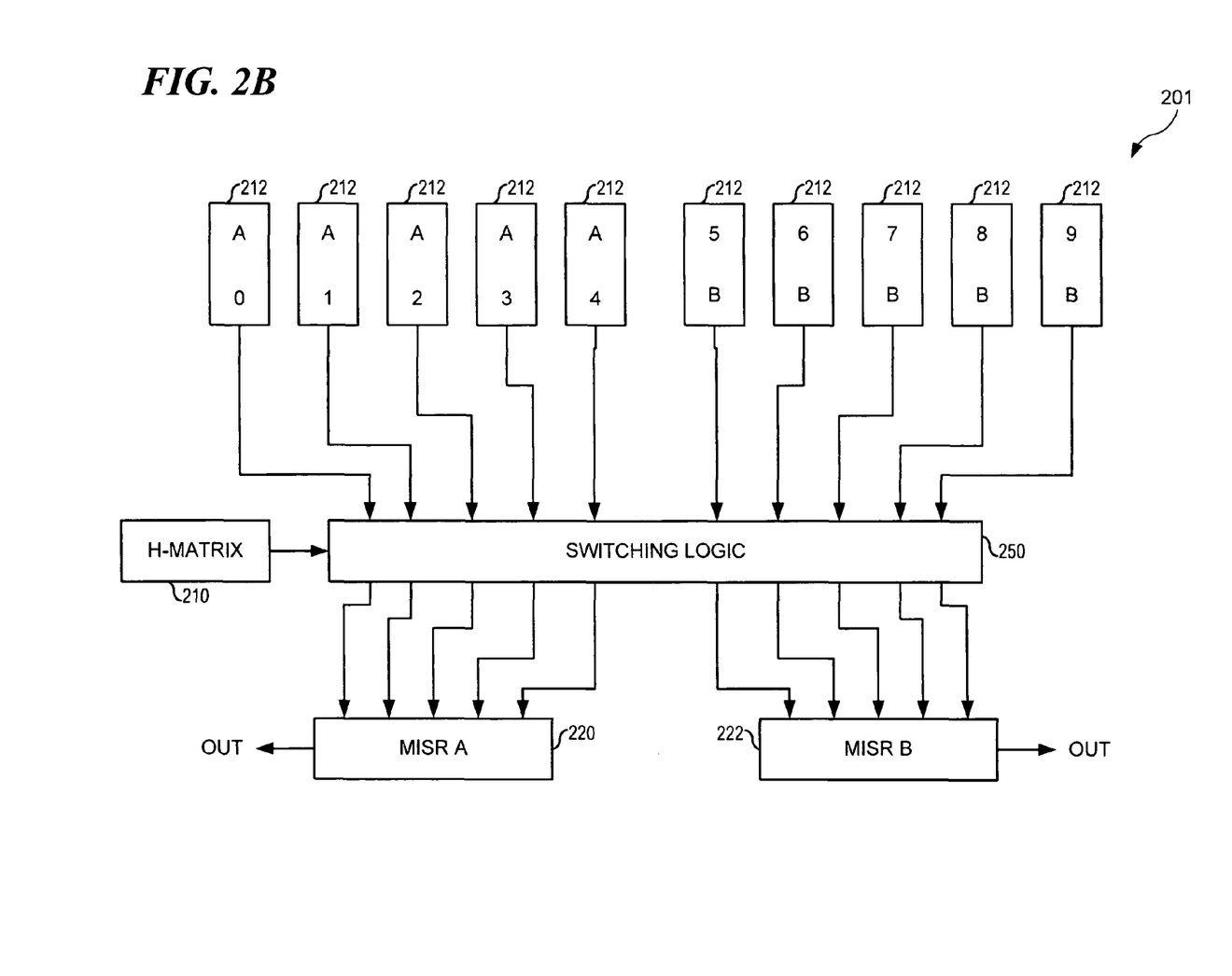

Referring now to FIG. 2B, a system 201 illustrates an improved scan chain fail diagnostic system in accordance with one embodiment of the present invention. Specifically, a switching logic 250 couples to a plurality of scan chains 212, h-matrix 210, MISR A 220, and MISR B 222. Switching logic 250 couples the scan chains 212 to one of MISR A 220 or MISR B 222 based on a select signal from H-matrix 210. In one embodiment, the select signal from H-matrix 210 is an H-matrix entry. As described above, in a preferred embodiment, the H-matrix 210 entries can be configured to minimize the number of steps necessary to identify a failing scan chain.

In the illustrated embodiment, switching logic 250 couples entire scan chains 212 to one of the MISRs, where each MISR is one of an independent pair. In an alternate embodiment, switching logic 250 couples a portion of one or more scan chains to the default MISR for that scan chain. In an alternate embodiment, switching logic 250 couples a portion of one or more scan chains to one of the MISRs.

Figure 3:
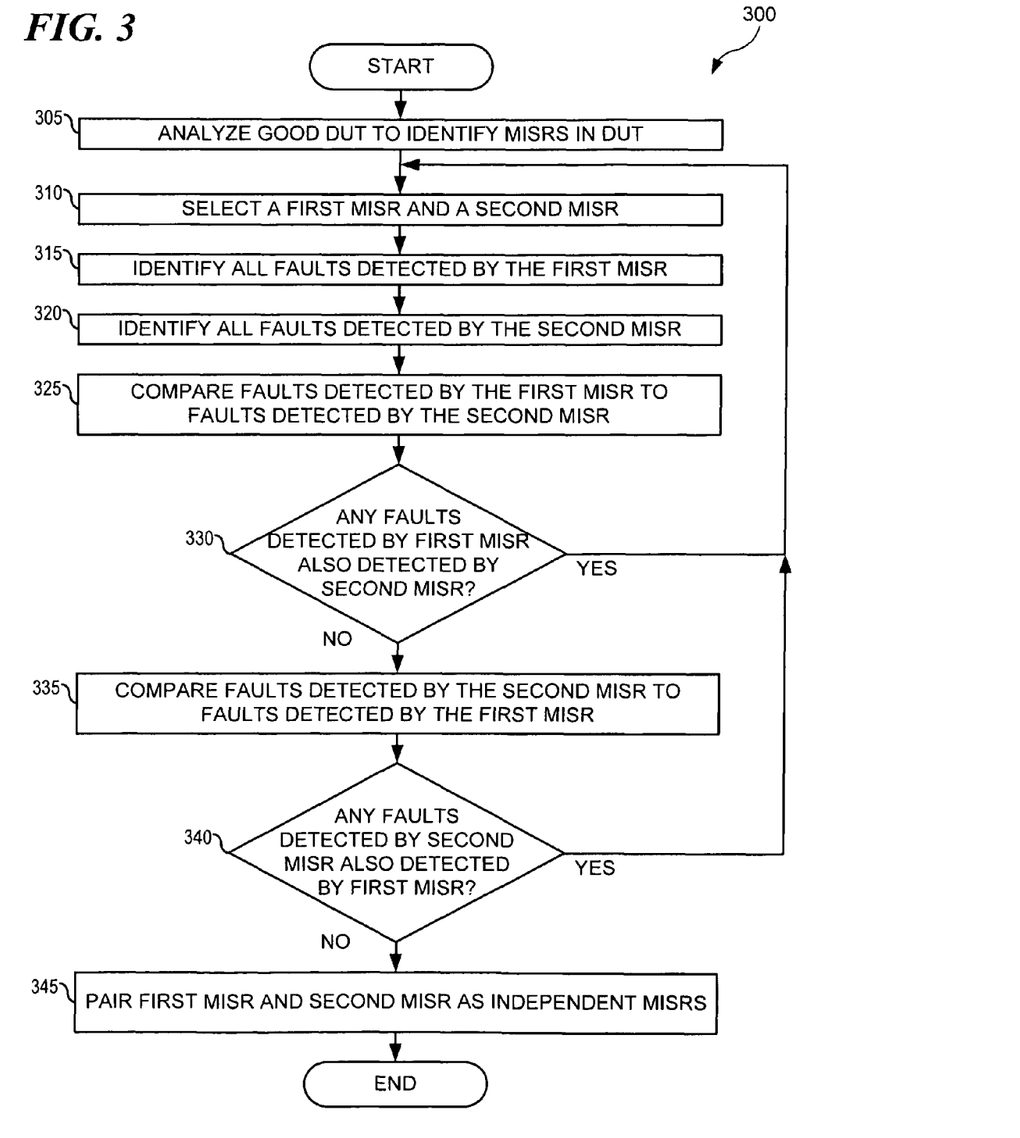
FIG. 3 illustrates a high-level flow diagram depicting logical operational steps of an improved scan chain fail diagnosis method, which can be implemented in accordance with a preferred embodiment.

Referring now to FIG. 3, flow diagram 300 illustrates exemplary operative steps of an improved scan chain diagnostic method as performed by system 100 of FIG. 1. Generally, testing module 110 performs the steps of the method, unless indicated otherwise. As indicated at block 305, the process begins and the testing module analyzes a known good DUT to identify all MISRs within the DUT. For example, testing module 110 analyzes DUT 120, and MISR identification unit 111 identifies all MISRs in DUT 120.

Next, as indicated at block 310, system 100 selects a first MISR in the DUT and a second MISR in the DUT. For example, MISR identification module 111 selects a first MISR, MISR A 150, and a second MISR, MISR B 152. Next, as indicated at block 315, system 100 identifies all faults detected by the first MISR. For example, MISR identification unit 111 identifies all faults detected by MISR A 150. Next, as indicated at block 320, system 100 identifies all faults detected by a second MISR. For example, MISR identification unit 111 identifies all faults detected by MISR B 152. In one embodiment, system 100 identifies all faults detected by a MISR by identifying the faults detected by the default scan chains coupled to the MISR.

Next, as indicated at block 325, system 100 compares the faults detected by the first MISR to the faults detected by the second MISR. For example, MISR comparison module 113 compares the faults detected by MISR A 150 and the faults detected by MISR B 152. Next, as indicated at decisional block 330, system 100 determines whether any faults detected by the first MISR are also detected by the second MISR. For example, MISR comparison module 113 determines whether any faults detected by MISR A 150 are also detected by MISR B 152.

In the event one or more faults detected by the first MISR are also detected by the second MISR, the process continues along the YES branch, returning to block 310, wherein the system selects a new first or second MISR. In the event no faults detected by the first MISR are also detected by the second MISR, the process continues along the NO branch, to block 335. As indicated at block 335, system 100 compares faults detected by the second MISR to the faults detected by the first MISR. For example, MISR comparison module 113 compares the faults detected by MISR B 152 to the faults detected by MISR A 150.

Next, as indicated at decisional block 340, system 100 determines whether any faults detected by the second MISR are also detected by the first MISR. For example, MISR comparison module 113 determines whether any faults detected by MISR B 152 are also detected by MISR A 150.

In the event one or more faults detected by the second MISR are also detected by the first MISR, the process continues along the YES branch, returning to block 310, wherein the system selects a new first or second MISR. In the event no faults detected by the second MISR are also detected by the first MISR, the process continues along the NO branch, to block 345.

As indicated at block 345, system 100 pairs the first MISR and the second MISR as independent MISRs. For example, testing module 110 marks MISR A 150 and MISR B 152 as an independent MISR pair. The process ends.

Figure 4:
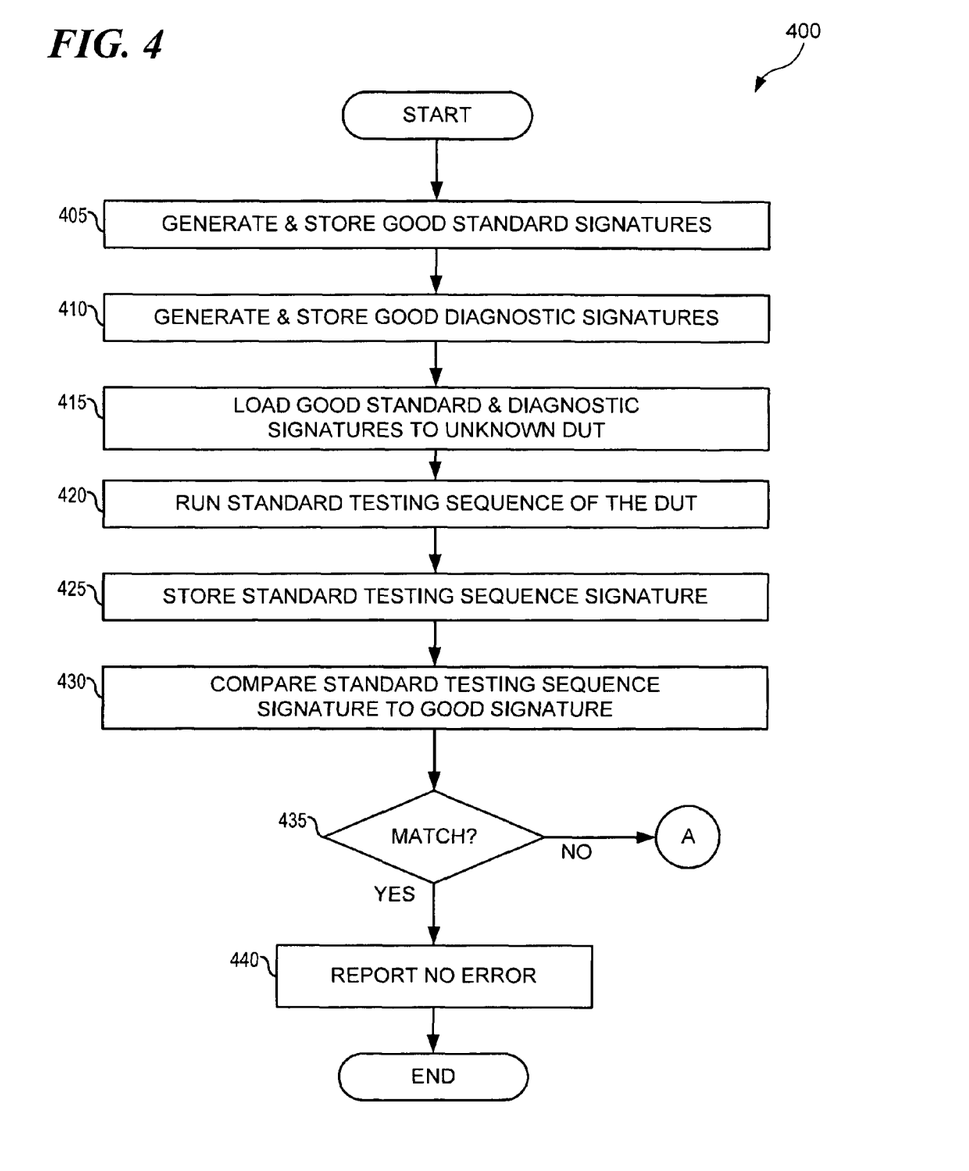
FIG. 4 illustrates a high-level flow diagram depicting logical operational steps of an improved scan chain fail diagnosis method, which can be implemented in accordance with a preferred embodiment.

Referring now to FIG. 4, flow diagram 400 illustrates exemplary operative steps of an improved scan chain diagnostic method as performed by system 100 of FIG. 1. Generally, testing module 110 performs the steps of the method, unless indicated otherwise. As indicated at block 405, the process begins and the testing module generates and stores good standard signatures for the DUT.

Next, as indicated at block 410, system 100 generates and stores good diagnostic signatures for the DUT. Next, as indicated at block 415, system 100 loads the good standard signatures and good diagnostic signatures to a DUT configured with the same circuitry as the good DUT, but of unknown status ("an unknown DUT").

Next, as indicated at block 420, system 100 runs a standard testing sequence of the unknown DUT. Next, as indicated at block 425, system 100 stores the resultant standard testing sequence signature. Next, as indicated at block 430, system 100 compares the stored standard testing sequence to the known good standard signature.

As indicated at decisional block 430, in the event the stored standard testing sequence matches the known good standard signature, the process continues along the YES branch to block 440. As indicated at block 440, the system reports "no error" and the process ends. If at decisional block 430 the stored standard testing sequence does not match the known good standard signature, the process continues along the NO branch to Marker "A" of FIG. 5.

Figure 5:
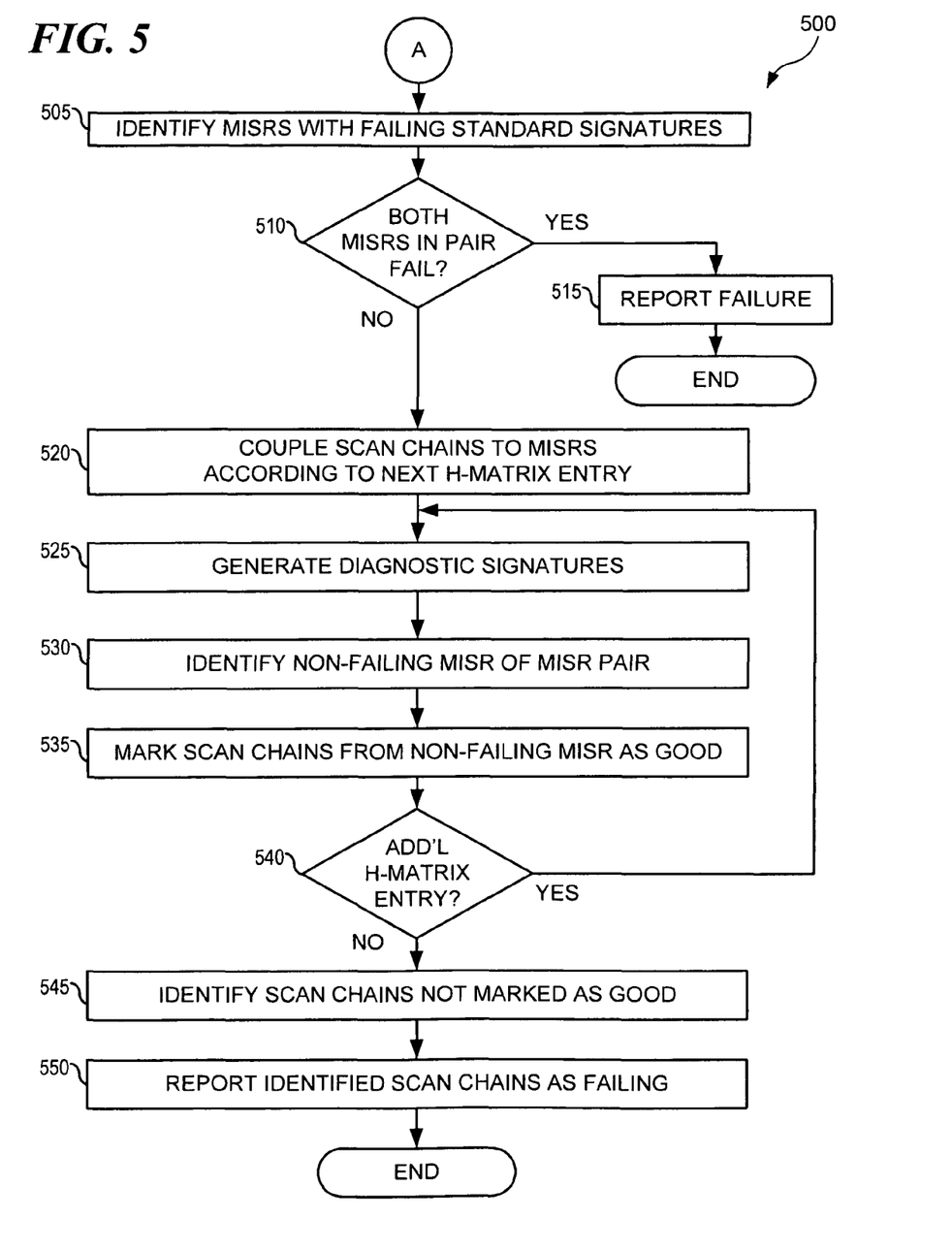
FIG. 5 illustrates a high-level flow diagram depicting logical operational steps of an improved scan chain fail diagnosis method, which can be implemented in accordance with a preferred embodiment.

Referring now to FIG. 5, flow diagram 500 illustrates exemplary operative steps of an improved scan chain diagnostic method as performed by system 100 of FIG. 1. Generally, testing module 110 performs the steps of the method, unless indicated otherwise. The process begins at Marker "A" and continues to block 505. As indicated at block 505, system 100 identifies those MISRs with failing standard signatures.

Next, as indicated at decisional block 510, system 100 determines whether both MISRs of an independent pair have failed. In the event both MISRs of an independent pair have failed, the process continues along the YES branch to block 515. As indicated at block 515, system 100 reports an unidentified failure and the process ends. In one embodiment, system 100 reports to a user that the system cannot determine which scan chain has failed.

If at decisional block 510 both MISRs of an independent pair have not failed, the process continues along the NO branch to block 520. As indicated at block 520, system 100 couples the scan chains to the MISRs according to the next H-matrix entry. On the first iteration, the "next" H-matrix entry is the first H-matrix entry.

Next, as indicated at block 525, system 100 generates diagnostic signatures with the scan chains configured according to the current H-matrix entry. Next, as indicated at block 530, system 100 identifies a non-failing MISR of an independent MISR pair. In one embodiment, system 100 compares the known good diagnostic signatures with the generated diagnostic signatures for each MISR to identify which MISRs generate failing signatures.

Next, as indicated at block 535, system 100 marks the scan chains coupled to the non-failing MISRs as "good." In one embodiment, the current H-matrix entry indicates which scan chains couple to the MISRs. Next, as indicated at decisional block 540, system 100 determines whether there is an additional H-matrix entry. If at decisional block 540 there is an additional H-matrix entry, the process continues along the YES branch, returning to block 520. If at decisional block 540 there is not an additional H-matrix entry, the process continues along the NO branch to block 545.

Next, as indicated at block 545, system 100 identifies the scan chains not marked as "good." In one embodiment, system 100 ANDs a plurality of columns representing each scan chain and identifies those columns that retain a logic high value. Next, as indicated at block 550, system 100 reports any identified scan chains as failing and the process ends.

Thus, generally, the processes described in the operational steps of flow diagrams 300, 400, and 500 of FIGS. 3, 4, and 5, respectively, illustrate an improved method for scan chain fail diagnostics. Accordingly, the disclosed embodiments provide numerous advantages over other methods and systems. For example, the present invention obtains the benefit of decreased data production gained by utilizing MISRs in the testing process. Use of MISRs in the testing process effectively reduces the total output data of the standard testing sequence down to the width of the MISR (usually between 15 and 40 bits from 100,000×50,000).

Additionally, the disclosed embodiments achieve reduction in data production from MISR utilization without the increased difficulties and time consumption of diagnosing fails within the system. A system employing the disclosed method eliminates the need to step through each scan chain serially while masking off each of the other scan chains in order to find a failing scan chain. Avoiding the masking process significantly reduces test time, and avoids the problems created when utilizing MISRs in conventional testing systems.

Further, the disclosed embodiments improve fault diagnostics over prior art binary search methods. Generally, binary search methods require similar test runs to identify failing scan chains, and must run all scan chains to identify uniqueness. While binary search methods can identify a failing scan chain, most methods cannot identify whether a failing signature is the result of one or many failing scan chains. The disclosed embodiments allow for both distinguishing between a single- or multiple-chain fail, and for identifying failing scan chains in fewer runs.

Further, the disclosed embodiments require less manpower and resources to perform fault diagnostics in modern VLSI systems. For example, typical test diagnostic systems require individual testing of each scan chain within the system to identify which scan chain has a fail. Once the failing scan chain has been isolated, the system must step through each latch value within the scan chain. The disclosed embodiments, however, automate these processes using system memory to minimize the amount of memory required for compares. Additionally, in one embodiment, the testing system utilizes only the end MISR signature for different MISR configurations, greatly simplifying simulations.

As such, the disclosed embodiments can be configured to run automatically, in fewer test runs than currently known solutions. For example, for a worst-case test time under current methods of 11 full runs, the disclosed embodiments require only 5 full runs. Similarly, for a 32-bit MISR, the prior art solutions require 32 test runs, while the disclosed embodiments require only 8 full test runs.

Furthermore, judicious MISR pairing can reduce the probability of aliasing in diagnostic results. In prior art systems, aliasing—identical signatures for non-identical circuit states—can mask independent faults present within multiple MISRs. The disclosed embodiments can be configured with MISRs as independent pairs, which significantly reduces problems identifying failing scan chains that are caused by aliasing.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

One skilled in the art will appreciate that variations of the above-disclosed and other features and functions, or alternatives thereof, may be desirably combined into many other different systems or applications. Additionally, various presently unforeseen or unanticipated alternatives, modifications, variations or improvements therein may be subsequently made by those skilled in the art, which are also intended to be encompassed by the following claims.

What is claimed is:

1. A method, comprising:
   generating a test pattern for a device under test (DUT), wherein the DUT comprises a plurality of scan chains coupled to a plurality of multiple input shift registers (MISRs);
   identifying a first plurality of faults detected by a first MISR of the plurality of MISRs;
   identifying a second plurality of faults detected by a second MISR of the plurality of MISRs;
   in the event the first plurality of faults detected by the first MISR does not include any of the second plurality of faults detected by the second MISR and the second plurality of faults detected by the second MISR does not include any of the first plurality of faults detected by the first MISR, coupling the first MISR and the second MISR as an independent MISR pair;
   applying the test pattern to the DUT to generate a scan chain output;
   capturing, by the independent MISR pair, the scan chain output to generate a test signature; and
   comparing the test signature with a known good signature.

2. The method of claim 1, wherein coupling the first MISR and the second MISR as an independent MISR pair comprises generating an H-matrix.

3. The method of claim 1, wherein coupling the first MISR and the second MISR as an independent MISR pair comprises:
   identifying the scan chains that feed into each position in the first MISR and the second MISR; and
   for at least one position in a selected MISR of the first MISR and the second MISR, selecting either the scan chain that feeds into the selected MISR or the scan chain that feeds into the non-selected MISR.

4. The method of claim 3, further comprising generating an H-matrix to select between the scan chain that feeds into the selected MISR or the scan chain that feeds into the non-selected MISR in the independent MISR pair.

5. The method of claim 1, further comprising generating known good signatures for each connection in an H-matrix.

6. The method of claim 1, wherein comparing the test signature with a known good signature further comprises:

determining whether the test signature of the first MISR matches a known good signature for the first MISR;

determining whether the test signature of the second MISR matches a known good signature for the second MISR; and in the event the test signature of the first MISR does not match the known good signature for the first MISR, and the test signature of the second MISR does not match the known good signature for the second MISR, reporting the independent MISR pair failure.

7. The method of claim 1, further comprising:

identifying a first plurality of scan chains that feed into at least one position in the first MISR and the second MISR;

coupling the first plurality of scan chains to the first MISR and the second MISR according to a first H-matrix entry;

wherein at least one H-matrix entry indicates, for at least one position in a selected MISR of the first MISR and the second MISR, a selection of either the scan chain that feeds into that the selected MISR or the scan chain that feeds into the non-selected MISR;

capturing a first test signature with the independent MISR pair configured according to the first H-matrix entry;

coupling the first plurality of scan chains to the first MISR and the second MISR according to a second H-matrix entry;

capturing a second test signature with the independent MISR pair configured according to the first H-matrix entry; and identifying a failing scan chain based on the first test signature and the second test signature.

8. A computer program product for improved scan chain fail diagnostics, the computer program product stored on a non-transitory computer usable medium having computer usable program code embodied therewith, the computer useable program code comprising:

computer usable program code configured to generate a test pattern for a device under test (DUT), wherein the DUT comprises a plurality of scan chains coupled to a plurality of multiple input shift registers (MISRs);

computer usable program code configured to identify a first plurality of faults detected by a first MISR of the plurality of MISRs;

computer usable program code configured to identify a second plurality of faults detected by a second MISR of the plurality of MISRs;

computer usable program code configured to, in the event the first plurality of faults detected by the first MISR does not include any of the second plurality of faults detected by the second MISR and the second plurality of faults detected by the second MISR does not include any of the first plurality of faults detected by the first MISR, couple the first MISR and the second MISR as an independent MISR pair;

computer usable program code configured to apply the test pattern to the DUT to generate a scan chain output;

computer usable program code configured to capture, by the independent MISR pair, the scan chain output to generate a test signature; and computer usable program code configured to compare the test signature with a known good signature.

9. The computer program product of claim 8, wherein coupling the first MISR and the second MISR as an independent MISR pair comprises generating an H-matrix.

10. The computer program product of claim 8, wherein coupling the first MISR and the second MISR as an independent MISR pair comprises:

identifying the scan chains that feed into at least one position in the first MISR and the second MISR; and for at least one position in a selected MISR of the first MISR and the second MISR, selecting either the scan chain that feeds into the selected MISR or the scan chain that feeds into the non-selected MISR in the independent MISR pair.

11. The computer program product of claim 10, further comprising computer usable program code configured to generate an H-matrix to select between the scan chain that feeds into that MISR or the scan chain that feeds into the other MISR in the independent MISR pair.

12. The computer program product of claim 8, further comprising computer usable program code configured to generate known good signatures for each connection in an H-matrix.

13. The computer program product of claim 8, wherein comparing the test signature with a known good signature further comprises:

determining whether the test signature of the first MISR matches a known good signature for the first MISR;

determining whether the test signature of the second MISR matches a known good signature for the second MISR; and in the event the test signature of the first MISR does not match the known good signature for the first MISR, and the test signature of the second MISR does not match the known good signature for the second MISR, reporting the independent MISR pair failure.

14. The computer program product of claim 8, further comprising:

computer usable program code configured to identify the scan chains that feed into at least one position in the first MISR and the second MISR;

computer usable program code configured to couple the scan chains to the first MISR and the second MISR according to a first H-matrix entry;

wherein each h-matrix entry indicates, for at least one position in at least one MISR a selection of either the scan chain that feeds into that MISR or the scan chain that feeds into the other MISR in the independent MISR pair;

computer usable program code configured to capture a first test signature with the independent MISR pair configured according to the first H-matrix entry;

computer usable program code configured to couple the scan chains to the first MISR and the second MISR according to a second H-matrix entry;

computer usable program code configured to capture a second test signature with the independent MISR pair configured according to the first H-matrix entry; and computer usable program code configured to identify a failing scan chain based on the first test signature and the second test signature.

15. A system, comprising:

a testing module configured to generate a test pattern for a device under test (DUT), wherein the DUT comprises a plurality of scan chains coupled to a plurality of multiple input shift registers (MISRs);

the testing module comprising a signature generation module configured to identify a first plurality of faults detected by a first MISR of the plurality of MISRs and to identify a second plurality of faults detected by a second MISR of the plurality of MISRs;

the testing module further comprising a MISR comparison module configured to, in the event the first plurality of faults detected by the first MISR does not include any of the second plurality of faults detected by the second MISR and the second plurality of faults detected by the second MISR does not include any of the first plurality of faults detected by the first MISR, couple the first MISR and the second MISR as an independent MISR pair;

the testing module further configured to apply the test pattern to the DUT to generate a scan chain output;

wherein the independent MISR pair is configured to capture the scan chain output to generate a test signature; and wherein the testing module comprises a signature comparison module configured to compare the test signature with a known good signature.

16. The system of claim 15, wherein the MISR comparison module is further configured to:
identify the scan chains that feed into at least one position in the first MISR and the second MISR; and
for at least one position in at least one MISR, select either the scan chain that feeds into that MISR or the scan chain that feeds into the other MISR in the independent MISR pair.

17. The system of claim 15, further comprising an H-matrix comprising a plurality of sequences of bits, each bit configured to select between the scan chain that feeds into the first MISR or the scan chain that feeds into the second MISR in the independent MISR pair.

18. The system of claim 17, further comprising a plurality of known good signatures for each connection in an H-matrix.

19. The system of claim 15, wherein the signature comparison module is further configured to:
determine whether the test signature of the first MISR matches a known good signature for the first MISR;
determine whether the test signature of the second MISR matches a known good signature for the second MISR; and
in the event the test signature of the first MISR does not match the known good signature for the first MISR, and the test signature of the second MISR does not match the known good signature for the second MISR, report the independent MISR pair failure.

20. The system of claim 15, further comprising:
wherein the MISR comparison module is further configured to identify the scan chains that feed into at least one position in the first MISR and the second MISR;
wherein the testing module is further configured to couple the scan chains to the first MISR and the second MISR according to a first H-matrix entry;
wherein at least one H-matrix entry indicates, for at least one position in each MISR, a selection of either the scan chain that feeds into that MISR or the scan chain that feeds into the other MISR in the independent MISR pair;
wherein the testing module is further configured to capture a first test signature with the independent MISR pair configured according to the first H-matrix entry;
wherein the testing module is further configured to couple the scan chains to the first MISR and the second MISR according to a second H-matrix entry;
wherein the testing module is further configured to capture a second test signature with the independent MISR pair configured according to the first H-matrix entry; and
wherein the testing module is further configured to identify a failing scan chain based on the first test signature and the second test signature.

* * * * *